United States Patent
Melzer et al.

(10) Patent No.: US 11,156,709 B2
(45) Date of Patent: Oct. 26, 2021

(54) PHASE MEASUREMENT IN A RADAR SYSTEM

(71) Applicant: Infineon Technologies AG, Neubiberg (DE)

(72) Inventors: Alexander Melzer, Neutillmitsch (AT); Bernhard Gstoettenbauer, Engerwitzdorf (AT); Alexander Onic, Linz (AT); Clemens Pfeffer, Linz (AT); Christian Schmid, Linz (AT)

(73) Assignee: Infineon Technologies AG

( * ) Notice: Subject to any disclaimer, the term of this patent is extended or adjusted under 35 U.S.C. 154(b) by 308 days.

(21) Appl. No.: 16/440,211

(22) Filed: Jun. 13, 2019

(65) Prior Publication Data

US 2019/0383929 A1    Dec. 19, 2019

(30) Foreign Application Priority Data

Jun. 15, 2018 (DE) .......................... 102018114471.7

(51) Int. Cl.
| | | |
|---|---|---|
| *G01S 13/58* | (2006.01) | |
| *H03L 7/081* | (2006.01) | |
| *H04L 7/033* | (2006.01) | |
| *H03L 7/099* | (2006.01) | |
| *H03L 7/091* | (2006.01) | |

(52) U.S. Cl.
CPC .............. *G01S 13/58* (2013.01); *H03L 7/081* (2013.01); *H03L 7/091* (2013.01); *H03L 7/0991* (2013.01); *H04L 7/033* (2013.01)

(58) Field of Classification Search
None
See application file for complete search history.

(56) References Cited

U.S. PATENT DOCUMENTS

| | | | |
|---|---|---|---|
| 7,876,261 B1 | 1/2011 | Adams | |
| 8,686,736 B2* | 4/2014 | Forstner | G01R 31/2822 324/537 |
| 10,684,363 B2* | 6/2020 | Starzer | G01S 13/87 |
| 2003/0128152 A1* | 7/2003 | Puglia | G01S 13/18 342/70 |
| 2008/0278370 A1* | 11/2008 | Lachner | G01S 7/03 342/200 |
| 2009/0081976 A1* | 3/2009 | Fujii | H04B 1/0082 455/209 |
| 2020/0096603 A1* | 3/2020 | Schmidt | G01S 13/34 |

* cited by examiner

*Primary Examiner* — Cassandra F Cox
(74) *Attorney, Agent, or Firm* — Design IP

(57) ABSTRACT

A radar system includes a first radar chip with a first RF contact, a second radar chip with a second RF contact, an RF signal path connecting the first RF contact to the second RF contact, and a local oscillator arranged in the first radar chip and configured to generate an RF oscillator signal, and which is coupled to the first RF contact to transmit the RF oscillator signal to the second radar chip. A feedback circuit arranged in the second radar chip is switchably connected to the second RF contact and is configured to reflect at least part of the RF oscillator signal arriving over the RFRF signal path as an RF feedback signal. A measurement circuit, arranged in the first radar chip, coupled to the first RF contact via a coupler receives the RF feedback signal and is configured to determine a signal that represents a phase shift.

23 Claims, 6 Drawing Sheets

PHASE MEASUREMENT IN A RADAR SYSTEM

FIELD

The present description relates to the field of radar sensors, in particular a phase-locked loop with a voltage-controlled oscillator (VCO) for generating a radio-frequency (RF) oscillator signal.

BACKGROUND

Radio-frequency (RF) transmitters and receivers are found in a large number of applications, in particular in the field of wireless communication and radar sensors. In the automotive sector, there is an increasing need for radar sensors that are able to be used, inter alia, in driving assistance systems (advanced driver assistance systems, ADAS), such as for example in adaptive cruise control (ACC) or radar cruise control systems. Such systems are automatically able to adjust the speed of a motor vehicle, in order thereby to maintain a safe distance from other motor vehicles traveling in front (and from other objects and from pedestrians). Further applications in the automotive sector are for example blind spot detection, lane change assist and the like.

Modern radar systems use highly integrated RF circuits that may contain all of the core functions of an RF front end of a radar transceiver in a single chip package (single-chip transceiver). Such RF front ends may have, inter alia, an RF local oscillator (LO), power amplifiers, low-noise amplifiers (LNA) or mixers. In spite of this, radar devices may have a plurality of radar chips in order to be able to provide systems with a plurality of transmission (TX) channels and a plurality of reception (RX) channels. Such MIMO systems (MIMO=multiple-input multiple-output) may be used for example in order to be able to measure, in addition to the distance and speed of a radar target, also its angular position (azimuth and/or elevation angle) and therefore its spatial extent. Furthermore, a plurality of TX and/or RX channels are required for the use of what are known as beamforming techniques.

In systems with a plurality of TX channels and a plurality of TX antennas, the individual TX antennas usually emit coherent RF radar signals, and the TX channels require coherent RF input signals (local oscillator signals) with a defined phase for this purpose.

SUMMARY

A radar system is described. According to one exemplary embodiment, the radar system has a first radar chip with a first external RF contact, a second radar chip with a second RF contact, and an RF signal path that connects the first RF contact of the first radar chip to the second RF contact of the second radar chip. The radar system furthermore has a local oscillator arranged in the first radar chip and that is configured to generate an RF oscillator signal, and which is coupled to the first RF contact in order to transmit the RF oscillator signal to the second radar chip. A feedback circuit arranged in the second radar chip is connected to the second RF contact in a switchable manner and is configured to reflect at least part of the RF oscillator signal arriving over the RF line as RF feedback signal. A measurement circuit arranged in the first radar chip and coupled to the first RF contact via a coupler receives the RF feedback signal and is configured, on the basis of the RF feedback signal and the RF oscillator signal generated by the local oscillator, to determine a signal that represents a phase shift.

Also described is a radar chip that, according to one exemplary embodiment, has the following: an RF contact that is configured to receive an RF oscillator signal; a feedback circuit with a terminating impedance that is connected to the RF contact in a switchable manner and that has an impedance value such that the received RF oscillator signal is at least partly reflected; a transmission channel to which the RF oscillator signal received at the RF contact is fed as input signal and that is configured, on the basis of the input signal, to generate an RF output signal and to output it at an RF output.

A method for a radar system is furthermore described. According to one exemplary embodiment, the method includes generating an RF oscillator signal by way of a local oscillator in a first radar chip, transmitting the RF oscillator signal from the first radar chip to a second radar chip over an RF signal path; and generating an RF feedback signal that is based on the RF oscillator signal, wherein the RF feedback signal in the second radar chip is generated either through reflection of at least part of the RF oscillator signal or through decoupling part of the RF oscillator signal by way of a coupler. The method furthermore includes transmitting the RF feedback signal back to the first radar chip over the RF signal path; and determining a phase shift on the basis of the RF feedback signal and the RF oscillator signal.

BRIEF DESCRIPTION OF THE DRAWINGS

Exemplary embodiments are explained in more detail below with reference to drawings. The illustrations are not necessarily true to scale, and the exemplary embodiments are not restricted just to the aspects that are illustrated. Rather, value is placed on illustrating the principles underlying the exemplary embodiments. In the drawings.

DETAILED DESCRIPTION

Figure 1:
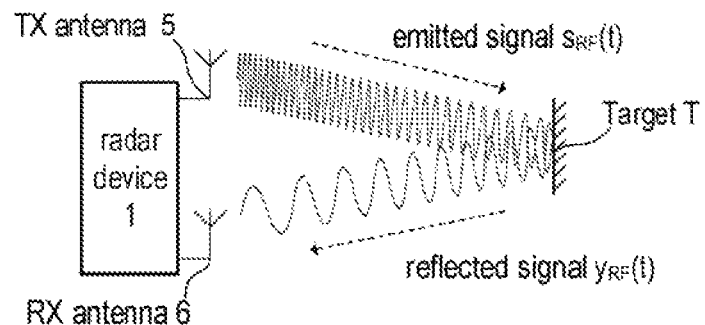
FIG. 1 is a sketch for illustrating the functional principle of an FMCW radar system for distance and/or speed measurement.

FIG. 1 illustrates a schematic diagram of the application of an FMCW radar system as a sensor for measuring distances and speeds of objects, which are normally referred to as radar targets. In the present example, the radar device 10 has separate transmission (TX) and reception (RX) antennas 5 and 6, respectively (bistatic or pseudo-monostatic radar configuration). It is however noted that a single antenna may also be used that serves simultaneously as transmission antenna and as reception antenna (monostatic radar configuration). The transmitter antenna 5 emits a continuous RF signal $s_{RF}(t)$, which is frequency-modulated for example with a type of sawtooth signal (periodic linear frequency ramp). The emitted signal $s_{RF}(t)$ is backscattered at the radar target T and the backscattered/reflected signal $y_{RF}(t)$ is received by the reception antenna 6. FIG. 1 shows a simplified example; in practice, radar sensors have systems with a plurality of transmission (TX) and reception (RX) channels in order also to be able to determine the angle of incidence (direction of arrival, DoA) of the backscattered/reflected signal $y_{RF}(t)$ and thus locate the radar target T with greater accuracy.

Figure 2:
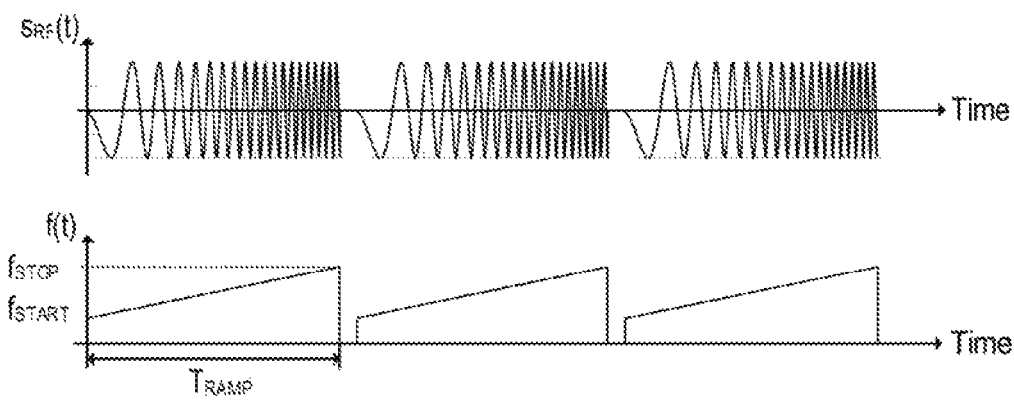
FIG. 2 comprises two timing diagrams for illustrating the frequency modulation (FM) of the RF signal generated by the FMCW system.

FIG. 2 illustrates, as an example, the mentioned frequency modulation of the signal $s_{RF}(t)$. As illustrated in FIG. 2 (top diagram), the emitted RF signal $s_{RF}(t)$ is composed of a series of "chirps", that is to say the signal $s_{RF}(t)$ comprises a sequence of sinusoidal signal profiles (waveforms) with rising frequency (up-chirp) or falling frequency (down-chirp). In the present example, the instantaneous frequency f(t) of a chirp increases linearly, starting at a start frequency $f_{START}$, to a stop frequency $f_{STOP}$ within a time interval $T_{RAMP}$ (see bottom diagram in FIG. 2). Such chirps are also referred to as linear frequency ramps. FIG. 2 illustrates three identical linear frequency ramps. It is however noted that the parameters $f_{START}$, $f_{STOP}$, $T_{RAMP}$ and the pause between the individual frequency ramps may vary. The frequency variation also does not necessarily have to be linear (linear chirp). Depending on the implementation, transmission signals with exponential or hyperbolic frequency variation (exponential or hyperbolic chirps) may also be used, for example.

Figure 3:
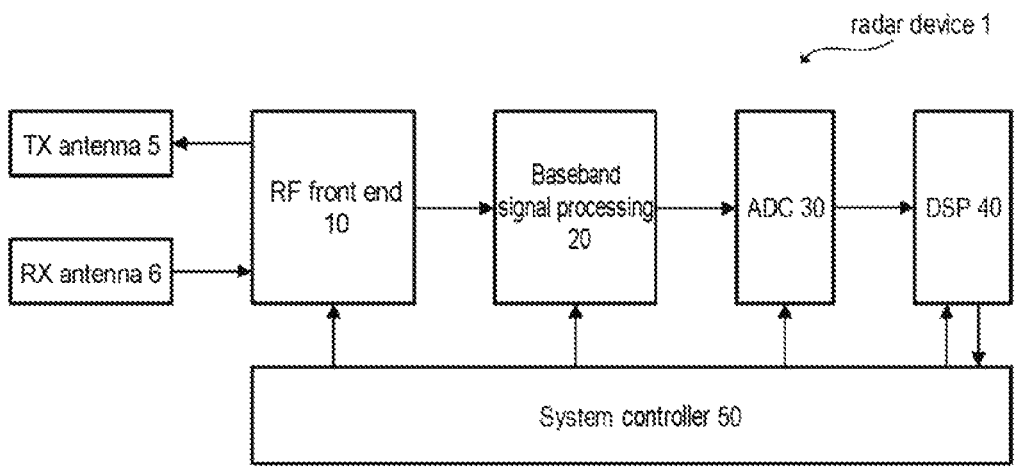
FIG. 3 is a block diagram for illustrating the fundamental structure of an FMCW radar system.

FIG. 3 is a block diagram that illustrates, as an example, one possible structure of a radar device 1 (radar sensor). Accordingly, at least one transmission antenna 5 (TX antenna) and at least one reception antenna 6 (RX antenna) are connected to an RF front end 10 integrated into a chip, which front end may contain all those circuit components that are required for RF signal processing. These circuit components comprise for example a local oscillator (LO), RF power amplifiers, low noise amplifiers (LNA), directional couplers (for example rat-race couplers, circulators, etc.), and mixers for downmixing (or down-converting) the RF signals into baseband or an intermediate frequency band (IF band). The RF front end 10 may—possibly together with further circuit components be integrated into a chip, which is usually referred to as a monolithic microwave integrated circuit (MMIC).

The example illustrated shows a bistatic (or pseudo-monostatic) radar system with separate RX and TX antennas. In the case of a monostatic radar system, a single antenna would be used both to emit and to receive the electromagnetic (radar) signals. In this case, a directional coupler (for example a circulator) may be used to separate the RF signals to be emitted from the received RF signals (radar echo signals). As mentioned, radar systems in practice usually have a plurality of transmission and reception channels (TX/RX channels) with a plurality of TX and RX antennas, which makes it possible, inter alia, to measure the direction (DoA) from which the radar echoes are received. In such MIMO systems, the individual TX channels and RX channels in each case usually have an identical or similar structure.

In the case of an FMCW radar system, the RF signals emitted by the TX antenna 5 may be for example in the range of approximately 20 GHz to 100 GHz (for example around 77 GHz in some applications). As mentioned, the RF signal received by the RX antenna 6 comprises the radar echoes (chirp echo signals), that is to say those signal components that are backscattered at one or at a plurality of radar targets. The received RF signal $y_{RF}(t)$ is downmixed for example into baseband (or an IF band) and processed further in baseband by way of analog signal processing (see FIG. 3, analog baseband signal processing chain 20). Said analog signal processing essentially comprises filtering and possibly amplifying the baseband signal. The baseband signal is finally digitized (see FIG. 3, analog-to-digital converter 30) and processed further in the digital domain. The digital signal processing chain may be implemented at least partly in the form of software that is able to be executed on a processor, for example a microcontroller, a digital signal processor (see FIG. 3, DSP 40) or another computer unit. The overall system is generally controlled by way of a system controller 50 that may likewise be implemented at least partly in the form of software that is able to be executed on a processor, such as for example a microcontroller. The RF front end 10 and the analog baseband signal processing chain 20 (optionally also the analog-to-digital converter 30) may be integrated together in a single MMIC (that is to say an RF semiconductor chip). As an alternative, the individual components may also be distributed over a plurality of integrated circuits.

Figure 4:
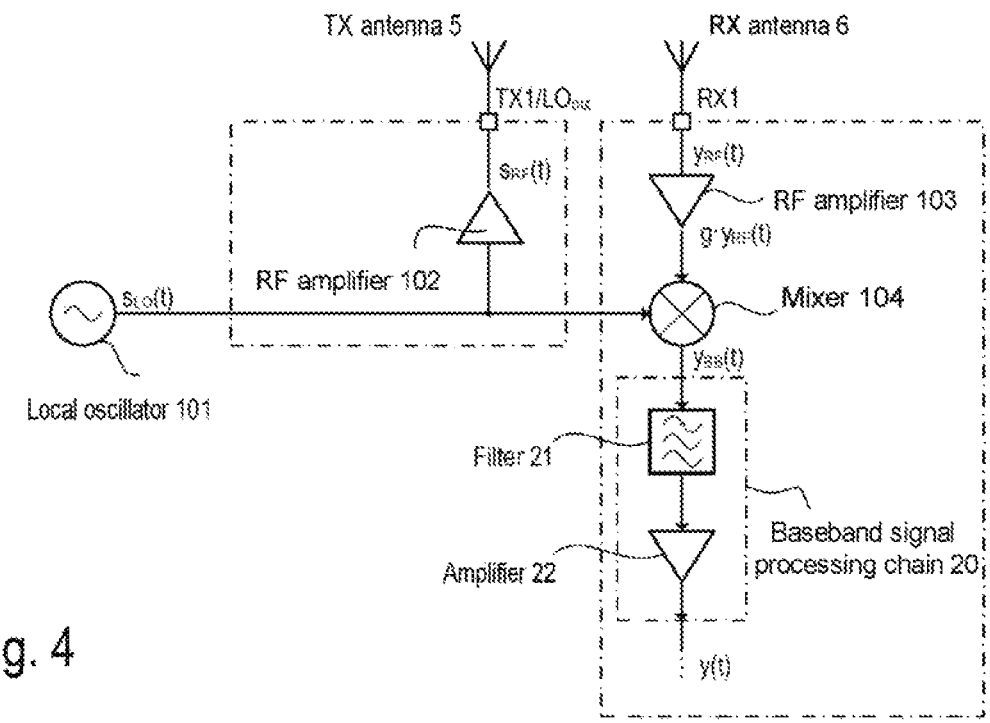
FIG. 4 is a block diagram for illustrating one example of an integrated RF front-end circuit of a radar chip.

FIG. 4 illustrates one exemplary implementation of a radar transceiver 1 according to the example from FIG. 3 in more detail. The present example in particular illustrates the RF front end 10 of the radar transceiver 1. It is noted that FIG. 4 illustrates a simplified circuit diagram in order to show the fundamental structure of the RF front end 10 with one TX channel and one RX channel. Actual implementations, which may depend greatly on the specific application, may of course be more complex and generally have a plurality of TX and/or RX channels.

The RF front end 10 comprises a local oscillator 101 (LO) that generates an RF oscillator signal $s_{LO}(t)$. During operation, as described above with reference to FIG. 2, the RF oscillator signal $s_{LO}(t)$ is frequency-modulated and is also referred to as LO signal. In radar applications, the LO signal is usually in the SHF (super high frequency, centimeter wave) or in the EHF (extremely high frequency, millimeter wave) band, for example in the interval from 76 GHz to 81 GHz in some automotive applications. The LO signal $s_{LO}(t)$ is processed both in the transmission signal path TX01 (in the TX channel) and in the reception signal path RX01 (in the RX channel). The local oscillator 101 usually contains a VCO wired in a phase-locked loop (PLL).

The transmission signal sRF(t) (cf. FIG. 2) emitted by the TX antenna 5 is generated by amplifying the LO signal $s_{LO}(t)$, for example by way of the RF power amplifier 102, and is thus merely an amplified version of the LO signal $s_{LO}(t)$. The output of the amplifier 102 may be coupled to an RF contact TX1 at which the amplified LO signal (RF transmission signal $s_{RF}(t)$) is output. The TX antenna 5, which emits the RF transmission signal as electromagnetic radar signal, is connected to the RF contact TX1 (in the case of a bistatic or pseudo-monostatic radar configuration). The reception signal $y_{RF}(t)$ received by the RX antenna 6 is fed to the receiver circuit in the RX channel and therefore directly or indirectly to the RF port of the mixer 104. In the present example, the RF reception signal $y_{RF}(t)$ (antenna signal) is pre-amplified by way of the amplifier 103 (amplification g). The mixer 104 thus receives the amplified RF reception signal g $y_{RF}(t)$. The amplifier 103 may be for example an LNA. The LO signal $s_{LO}(t)$ is fed to the reference port of the mixer 104, such that the mixer 104 downmixes the (pre-amplified) RF reception signal $y_{RF}(t)$ into baseband. The downmixed baseband signal (mixer output signal) is referred to as $y_{BB}(t)$. This baseband signal $y_{BB}(t)$ is initially processed further in an analog manner, wherein the analog baseband signal processing chain 20 essentially brings about amplification and (for example passband or low-pass) filtering in order to suppress undesired sidebands and mirror frequencies. The resulting analog output signal, which is fed to an analog-to-digital converter (see FIG. 3, ADC 30), is referred to as y(t). Methods for the digital further processing of the digitized output signal (digital radar signal y[n]) in order to detect radar targets are known per se (for example range Doppler analysis) and are therefore not discussed further here.

In the present example, the mixer 104 downmixes the pre-amplified RF reception signal g $y_{RF}(t)$ (that is to say the amplified antenna signal) into baseband. The mixing may be performed in one stage (that is to say from the RF band directly into baseband) or over one or more intermediate stages (that is to say from the RF band into an intermediate frequency band and further into baseband). In this case, the reception mixer 104 effectively comprises a plurality of individual mixer stages connected in series. With regard to the example shown in FIG. 4, it becomes clear that the quality of a radar measurement depends strongly on the quality of the LO signal $s_{LO}(t)$, for example on the noise contained in the LO signal $s_{LO}(t)$, which is determined in terms of quantity by the phase noise of the local oscillator 101 and the bandwidth of the phase-locked loop.

Figure 5:
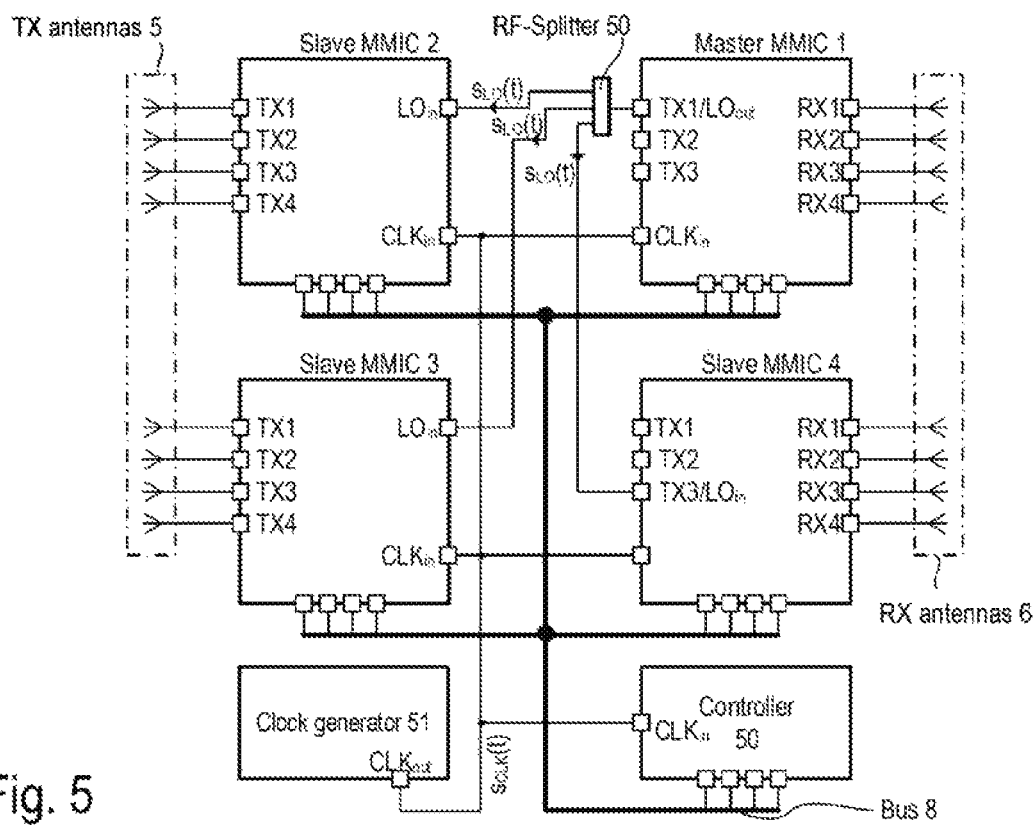
FIG. 5 is a block diagram for illustrating one example of a radar system with a plurality of cascaded radar chips (master and slave MMICs).

A radar chip (MMIC) generally has only a few transmission and reception channels. Radar systems with a plurality of channels may be constructed for example by cascading a plurality of radar chips. A multiplicity of transmission and reception channels may be required, in particular for high-resolution radar systems. FIG. 5 shows one example with four radar chips 1, 2, 3 and 4, wherein radar chip 1 operates as master MMIC 1, and the MMICs 2, 3 and 4 operate as slave MMICs. That is to say, the generation of the local oscillator signal $s_{LO}(t)$ takes place in the master MMIC 1, for example by way of a VCO wired in a phase-locked loop (PLL). The master MMIC 1 has an RF contact $LO_{out}$ at which the local oscillator signal (LO signal) is able to be output. By way of example, for this purpose, the RF output TX1 of a transmission channel may be configured as an LO output (RF contact $LO_{out}$). In the example illustrated, the RF contact $LO_{out}$ is connected to a power splitter 50 that splits the LO signal $s_{LO}(t)$ output at the RF contact $LO_{out}$ into three LO signals that are fed to the slave MMICs 2, 3 and 4. The slave MMICs 2, 3 and 4, for this purpose, each have an RF contact $LO_{in}$ that serves as LO input. The MMICs 1, 2, 3 and 4 and the RF splitter 50 may be arranged on a circuit board. In this case, the RF lines may be arranged between the MMICs and the splitter in the form of striplines. Other types of line (for example waveguides) may likewise be used. One or more of the slave MMICs may also be arranged on a different circuit board from the master MMIC. In this case, the various circuit boards are connected via waveguides in order to transmit the LO signal. The RF splitter 50 may be implemented in a metallization layer of the circuit board, for example as a Wilkinson splitter, other switching structures also being able to be used. The master MMIC 1 may also have a plurality of RF contacts $LO_{out}$ configured as LO outputs. In this case, the RF splitter may be integrated in the master MMIC.

In the example illustrated in FIG. 5, the slave MMICs 2 and 3 are designed essentially as multi-channel RF amplifiers that each have four antenna outputs TX1-TX4, which are each connected to transmission antennas 5. The transmission signals output on the antennas 5 are essentially amplified and possibly phase-shifted versions of the LO signals $s_{LO}(t)$ that are received on the RF contacts $LO_{in}$. The slave MMICs 2 and 3 in the illustrated example do not have any reception channels. The slave MMIC 4 may for example have the same structure as the master MMIC 1, but be configured as a slave. In the illustrated example, the slave MMIC 4 has an RF contact $LO_{in}$ configured as LO input. In another application, this RF contact could also alternatively be configured as RF output. Both the master MMIC 1 and the slave MMIC 4 each have four reception channels with the antenna inputs RX1-RX4, which are connected to the reception antennas 6. The transmission channels of MMIC 1 and MMIC 4 are not connected to antennas in the example shown in FIG. 5. In another exemplary embodiment, the unused transmission channels of the MMICs 1 and 4 in FIG. 5 could also be connected to antennas and be used to emit a radar signal.

In the example illustrated in FIG. 5, the radar system has a clock generator 51 that is integrated in a separate chip. As an alternative, the clock generator may also be integrated in the master MMIC 1, in one of the slave MMICs 1-4 or in the controller 50. The frequency of the clock signal $s_{CLK}(t)$ generated by the clock generator 51 and output at the clock output $CLK_{out}$ is significantly lower than that of the LO signal $s_{LO}(t)$, and is usually in the range of 50-500 MHz: higher and lower frequencies are possible. In the example illustrated, the controller 50 and the MMICs 1-4 each have a clock input $CLK_{in}$ to which the clock signal $s_{CLK}(t)$ is fed. The controller 50 and the MMICs 1-4 may each have a communication interface in order to allow data transmission between the controller 50 and the MMICs 1-4. In the illustrated example, the communication interface is a serial peripheral interface (SPI) for connecting the controller 50 and MMICs 1-4 via a digital serial bus 8. Other types of data transmission and interface are possible. The controller 50 may have one or more processors (with one or more processor cores), which make it possible to implement some functions of the controller 50 by way of software. In one exemplary embodiment, the controller 50 comprises a microcontroller, for example one from the Infineon AURIX microcontroller family.

Some of the information evaluated in a radar measurement is in the phase of the received (and downmixed into baseband) radar signals y(t) (see FIG. 4). For a useful measurement, the transmission signals emitted by the antennas 5 have to have a defined phase (in relation to one another). The phase of an RF transmission signal that is output for example at the RF output TX1 of the slave MMIC 2 however depends on various parameters, such as for example the length of the RF signal path between master MMIC 1 and slave MMIC 2 over which the LO signal $s_{LO}(t)$ is transmitted. The phase furthermore depends on the temperature of the master MMIC 1 and of the slave MMIC 2. In particular the length of the RF signal path over which the LO signal $s_{LO}(t)$ is transmitted is not within the sphere of influence of the chip designer, but rather is essentially defined only much later on when designing the circuit board. Furthermore, a phase change is caused by the extension or compression of the RF signal path due to temperature influences. The exemplary embodiments described below make it possible to measure the phase (in relation to a reference phase) of an LO signal $s_{LO}(t)$ fed to a slave MMIC or the RF transmission signal (antenna signal) generated therefrom, which, during normal radar operation, makes it possible to set a desired phase by way of phase shifters and therefore allows precise measurement (in particular in relation to the angular measurement (DoA) of objects).

Figure 6:
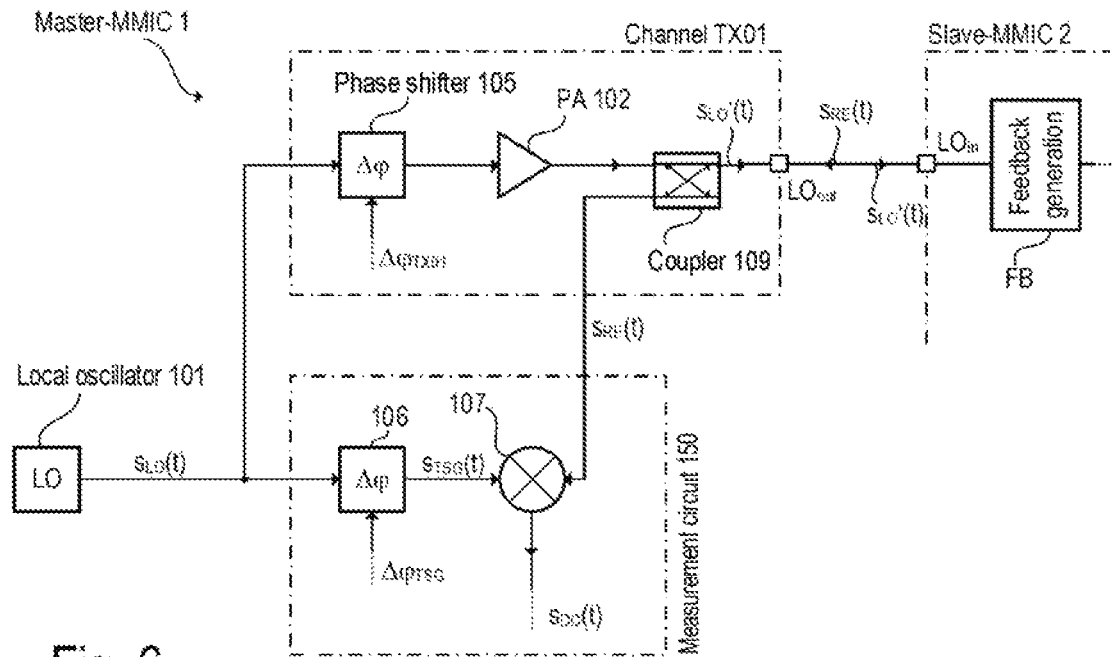
FIG. 6 shows one example of a master MMIC with a measurement circuit for measuring the phase of an RF feedback signal received from a slave MMIC.

FIG. 6 shows one example of a master MMIC 1, only those components that are relevant to the further discussion being illustrated. In particular, no reception channels are illustrated. These may be implemented for example as illustrated in the example according to FIG. 4. FIG. 6 illustrates a local oscillator 101, a transmission channel TX01, and a measurement circuit 150. The output signal of the local oscillator 101 is referred to as LO signal $s_{LO}(t)$. The LO signal $s_{LO}(t)$ is fed to the transmission channel TX01 as input signal. The transmission channel TX01 is essentially designed to amplify the LO signal $s_{LO}(t)$. The transmission channel TX01 to this end has an amplifier 102. A phase shifter 105 may be connected upstream or downstream of the amplifier 102. The phase shifter 105 brings about a settable phase shift $\Delta\varphi_{TX01}$, which may also be zero. The amplified and possibly phase-shifted LO signal is referred to as $s_{LO}'(t)$ and is output at the RF output of the channel TX01 (RF contact LO$_{out}$). The phase shifter 105 and the amplifier 102 are not important for the exemplary embodiments described here and may be considered to be optional. In spite of this, the phase shifter 105 in the TX channel of the master MMIC may be used to set the phase shift of the LO signal (in addition to or instead of the phase shifter 106 in the measurement circuit).

The (possibly amplified) LO signal $s_{LO}'(t)$ output at the RF contact LO$_{out}$ is transmitted to the slave MMIC 2 over an RF signal path (for example a microstrip line or another waveguide). The slave MMIC 2 has an RF contact LO$_{in}$ designed as LO input and at which the LO signal $s_{LO}'(t)$ output by the master MMIC is received. The slave MMIC 2 contains a feedback circuit FB, coupled to the RF contact LO$_{in}$ and designed either to reflect part of the received LO signal $s_{LO}(t)$ or to decouple it from the LO signal path in the slave MMIC 2 and to feed the decoupled signal back to the RF contact LO$_{in}$ again. The signal reflected in the feedback circuit FB or fed back by the feedback circuit is referred to as RF feedback signal $s_{RE}(t)$. Said signal is output at the RF contact LO$_{in}$ of the slave MMIC 2 and transmitted back to the master MMIC 1 and received again thereby at the RF contact LO$_{out}$.

The feedback signal $s_{RE}(t)$ fed back by the slave MMIC 2 or generated through reflection is fed to the measurement circuit 150 via a coupler 109. The coupler 109 may be a directional coupler, such as for example a rat-race coupler, a branch line coupler, a tapered line coupler, or a circulator, etc. Said coupler is arranged in the transmission channel TX01 close to the RF contact LO$_{out}$ and is designed to feed the LO signal $s_{LO}'(t)$ (for example coming from the amplifier 102) to the RF contact LO$_{out}$ and to feed the incoming feedback signal $s_{RE}(t)$ to the measurement circuit 150. The mode of operation and possible implementations of the coupler 109 are known per se and are therefore not explained further.

As mentioned, the feedback signal $s_{RE}(t)$ in the slave MMIC 2 may be generated by way of reflection or by decoupling and feeding back in the RF signal path between master MMIC 1 and slave MMIC 2. The feedback signal $s_{RE}(t)$ may be considered to be phase feedback, as it were, which makes it possible, in the master MMIC 1, to measure the phase of the LO signal $s_{LO}'(t)$ received in the slave MMIC 2.

Figure 7:
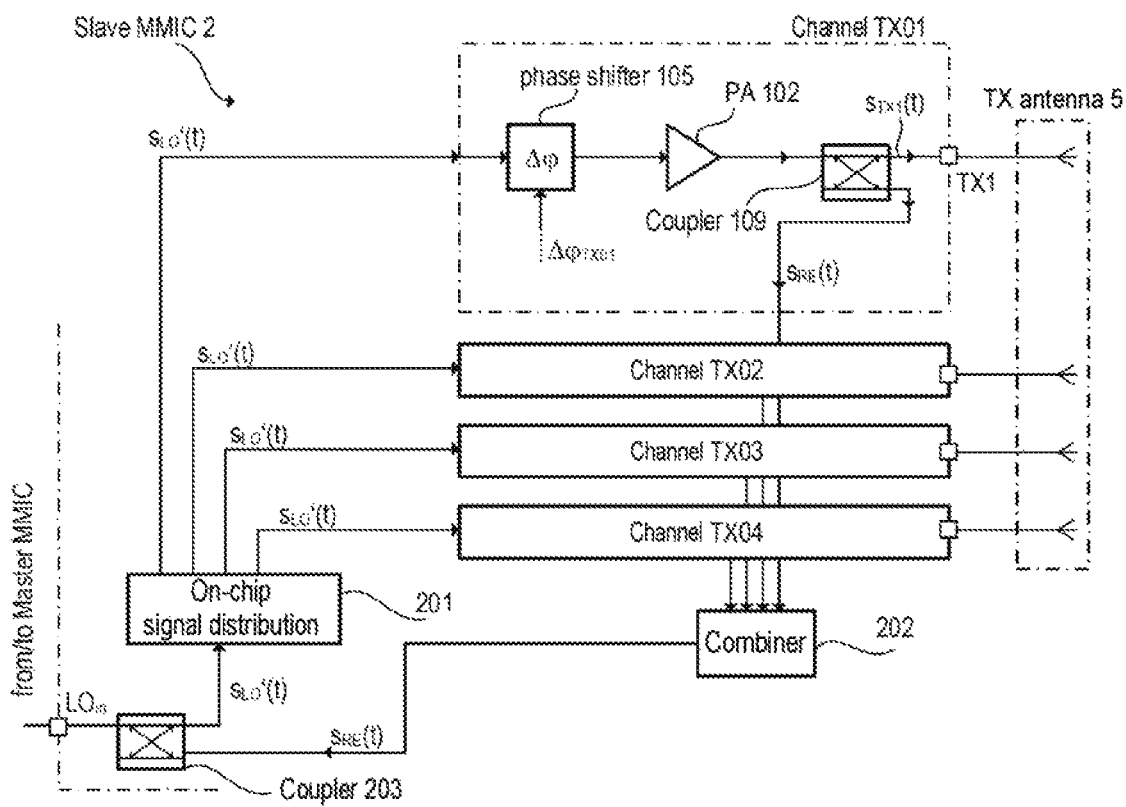
FIG. 7 shows one example of a slave MMIC, in which the RF feedback signal is generated in that part of the power of the local oscillator signal received from the master MMIC is decoupled for example directly upstream of an antenna port and is fed back to the master MMIC as RF feedback signal.

FIG. 7 shows one example of a slave MMIC 2, only those components that are relevant to the following discussion being illustrated. In the example illustrated, the feedback signal $s_{RE}(t)$ is generated by decoupling part of the transmission signal $s_{TX1}(t)$ (which is a phase-shifted and amplified version of the received LO signal $s_{LO}'(t)$), which is fed to a transmission antenna 5. According to FIG. 5, the slave MMIC 2 has four transmission channels TX01, TX02, TX03, TX04 that may have essentially the same structure. In other exemplary embodiments, more or fewer transmission channels may be present. The LO signal $s_{LO}'(t)$ received at the RF contact LO$_{in}$ is fed to the transmission channels TX01, TX02, TX03, TX04, wherein the on-chip signal distribution circuit 201 brings about the distribution of the LO signal $s_{LO}'(t)$ to the inputs of the transmission channels TX01, TX02, TX03, TX04. The on-chip signal distribution circuit 201 may have one or more power splitters (for example Wilkinson splitters). If only one transmission channel is present, no on-chip signal distribution circuit 201 is required.

In the example illustrated in FIG. 7, the transmission channel TX01 has a phase shifter 105, an RF amplifier 102 and a coupler 109. As is seen, the transmission channel TX01 of the slave MMIC 2 has the same structure as the transmission channel TX01 of the master MMIC 1 (see FIG. 6), but this does not necessarily have to be the case. The phase shifter 105 and the amplifier are connected in series and bring about an amplification and (settable) phase shift of the LO signal $s_{LO}'(t)$. The amplified and possibly phase-shifted signal is referred to as RF output signal $s_{TX1}(t)$. This is fed to the RF contact TX1, and thus to an antenna 5 that is connected to the RF contact TX1, by way of the coupler 109. The coupler 109 is furthermore designed to decouple part of the RF output signal $s_{TX1}(t)$. The decoupled signal is referred to as feedback signal $s_{RE}(t)$ and is likewise merely a scaled and phase-shifted version of the LO signal $s_{LO}'(t)$ received at the RF contact LO$_{in}$, and therefore also a scaled and phase-shifted version of the LO signal $s_{LO}(t)$ in the master MMIC 1.

If a plurality of transmission channels TX01, TX02, TX03, TX04 are present, each of these transmission channels delivers a feedback signal, wherein—for the measurement of the phase described below—only one transmission channel is ever active. The outputs of the couplers 109 arranged in the transmission channels, at which outputs the feedback signals $s_{RE}(t)$ are output, are connected to an RF combiner circuit 202, which may be implemented as a passive combiner circuit, such as for example as a Wilkinson combiner. Since, as mentioned, only one of the transmission channels TX01, TX02, TX03, TX04 is ever active, the output of the RF combiner circuit 202 delivers the feedback signal of the active transmission channel. If only one channel is present, no combiner circuit is required.

The feedback signal $s_{RE}(t)$ is fed back into the RF signal path between master MMIC 1 and slave MMIC 2 by way of the coupler 203. To this end, the coupler 203 is connected to the RF contact LO$_{in}$, the on-chip signal distribution circuit 201 and the RF combiner circuit 202, and is designed to forward the LO signal s$_{LO}$'(t) received at the RF contact LO$_{in}$ to the on-chip signal distribution circuit 201 and to forward the feedback signal s$_{RE}$(t) of the active transmission channel to the RF contact LO$_{in}$. The feedback signal s$_{RE}$(t) is thus transmitted back to the master MMIC 1.

Figure 8:
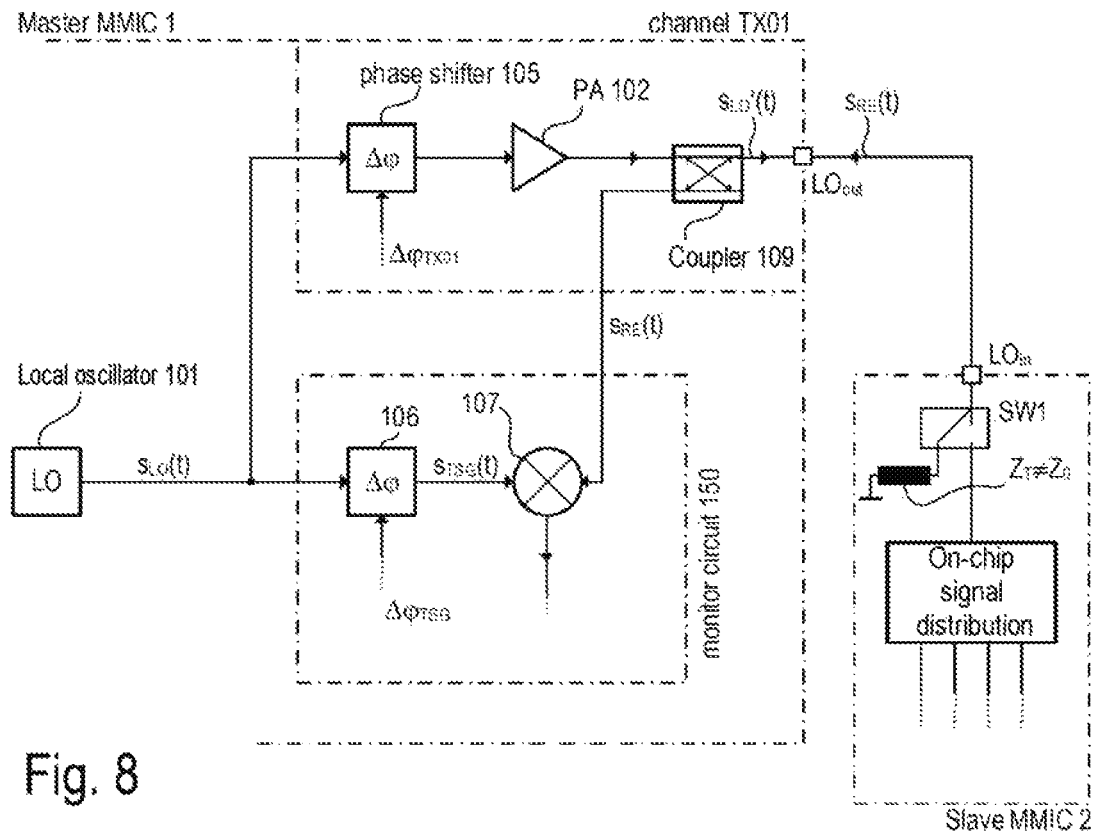
FIG. 8 shows one example of a master MMIC and of a slave MMIC, wherein, in the slave MMIC, the RF feedback signal is generated by way of reflection of the received local oscillator signal from an unmatched impedance.

In the master MMIC 1, the feedback signal s$_{RE}$(t) received at the RF contact LO$_{out}$ is fed to the measurement circuit 150 by way of the coupler 109 (see FIG. 6). Before the measurement circuit 150 is described in more detail, yet another variant for generating the feedback signal s$_{RE}$(t) is explained, in which the feedback signal s$_{RE}$(t) is generated by way of reflection. One example of this variant is illustrated in FIG. 8. The left-hand part of FIG. 8, which concerns the master MMIC 1, is identical to FIG. 6, and reference is made to the above description. The right-hand part of FIG. 8 concerns the slave MMIC 2, only the components relevant to the following discussion being illustrated. According to FIG. 8, the slave MMIC has an impedance Z$_T$ that is able to be electrically connected to the RF contact LO$_{in}$ by way of a switch SW1. The switch SW1 may be designed to connect either the impedance Z$_T$ or the on-chip signal processing circuit 201 to the RF contact LO$_{in}$. Apart from the switch SW1 and the impedance Z$_T$, the slave MMIC 2 may have essentially the same structure as in the previous example from FIG. 7 and have a plurality of transmission channels TX1, TX2, etc., the coupler 201 illustrated in FIG. 7 and the combiner 202 in the present example not being required.

To measure the phase of the LO signal s$_{LO}$'(t) received from the slave MMIC 2, the switch SW1 is set such that the impedance Z$_T$ is coupled to the RF contact LO$_{in}$. The impedance value of the impedance Z$_T$ is selected such that a specific portion of the incoming power of the LO signal s$_{LO}$'(t) is reflected as feedback signal s$_{RE}$(t). That is to say, the impedance Z$_T$ is unmatched, whereas the on-chip signal processing circuit 201 usually has an input impedance that is matched to the system impedance Z$_0$ in order as far as possible to avoid reflections. The impedance value may also represent a no-load situation (Z$_T$=∞) or a short circuit (Z$_T$=0). The setting of the switch may be set for example by the controller 50 by way of a communication connection (see FIG. 5, serial bus 8). As in the previous example (cf. FIG. 6), in the master MMIC 1, the reflected signal s$_{RE}$(t) (feedback signal) received at the RF contact LO$_{out}$ is fed to the measurement circuit 150 by way of the coupler 109 (see FIG. 6).

The following description of the measurement circuit 150 relates both to the example illustrated in FIG. 6 and to the example illustrated in FIG. 8. The measurement circuit 150 contains a mixer 107 to which firstly the feedback signal s$_{RE}$(t) and secondly a reference signal s$_{TSG}$(t) is fed, which reference signal may be a phase-shifted version of the LO signal s$_{LO}$(t) generated by the local oscillator 101. That is to say, $$s_{LO}(t) = A_{LO} \cdot \cos(2\pi f_{LO} t + \varphi_{LO}), \text{ and} \quad (1)$$

$$s_{TSG}(t) = A_{TSG} \cdot \cos(2\pi f_{LO} t + \varphi_{LO} + \Delta\varphi_{TSG}), \quad (2)$$

wherein, without restriction of generality, the amplitudes A$_{LO}$ and A$_{TSG}$ are equal to 1 and the phase angle $\varphi_{LO}$ may be set equal to zero. The feedback signal s$_{RE}$(t) may be described as follows (wherein A$_{LO}$=A$_{TSG}$=1 and $\varphi_{LO}$=0):

$$s_{RE}(t) = A_{RE} \cdot \cos(2\pi f_{LO} t + \Delta\varphi_{TX01} + \varphi_{RE}) \quad (3)$$

It is seen that the feedback signal s$_{RE}$(t) is merely a scaled and phase-shifted version of the LO signal s$_{LO}$(t), wherein the phase angle $\varphi_{RE}$ indicates that phase rotation that arises due to the transmission of the LO signal s$_{LO}$(t) from the local oscillator 101, through the channel TX01 of the master MMIC 1, over the RF signal path (transmission line) to the slave MMIC 2 and back as far as the measurement circuit 150 (the returning signal being referred to as feedback signal). The phase shift $\Delta\varphi_{TX01}$ is brought about by the phase shifter 105 in the transmission channel of the master MMIC 1 (see FIG. 6) or in the transmission channel of the slave MMIC 2 (see. 7). An inactive phase shifter does not cause any significant phase shift. It will be shown further below that a power detector may also be used instead of the mixer 107 (cf. FIG. 12). In the mixer 107, two RF signals having the same frequency f$_{LO}$ are superimposed, and the resulting DC output signal depends only on the phase difference of the two signals and their amplitudes. A similar result may also be achieved thereby when two RF signals are superimposed on the input of a power detector (RF power sensor) by way of a coupler, for example. The measured average power in this case likewise depends only on the signal amplitudes and the phase difference of the superimposed RF signals.

As illustrated in the examples from FIGS. 6 and 8, the mixer 107 receives the reference signal s$_{TSG}$(t) and the feedback signal s$_{RE}$(t) on its RF inputs. The mixer output signal s$_{DC}$(t) therefore contains the product s$_{TSG}$(t)·s$_{RE}$(t) of the two signals, that is to say $$s_{DC}(t) = s_{RE}(t) \cdot s_{TSG}(t) = \frac{A_{RE}}{2} \cdot \cos(\varphi_{RE} + \Delta\varphi_{TX01} - \Delta\varphi_{TSG}) + r(t), \quad (4)$$

wherein the term containing $$r(t) = \frac{A_{RE}}{2} \cdot \cos(4\pi f_{LO} t + \Delta\varphi_{TX01} + \varphi_{RE} + \Delta\varphi_{TSG}) \approx 0 \quad (5)$$

has the double LO frequency 2f$_{LO}$, which is suppressed due to the limited bandwidth of the mixer. The output signal s$_{DC}$(t) of the mixer 107 is thus a constant voltage (at constant phase angles $\Delta\varphi_{TX01}$, $\Delta\varphi_{TSG}$ and $\varphi_{RE}$). The phase difference $\Delta\varphi_{TX01}$−$\Delta\varphi_{TSG}$ is referred to as $\Delta\varphi_1$. The mixer output signal s$_{DC}$(t) may thus be written as follows:

$$s_{DC}(t) = \frac{A_{RE}}{2} \cdot \cos(\varphi_{RE} + \Delta\varphi_{TX01} - \Delta\varphi_{TSG}) = \frac{A_{RE}}{2} \cdot \cos(\varphi_{RE} + \Delta\varphi_1), \quad (4)$$

wherein the phase difference $\Delta\varphi_1$ is brought about by the phase shifter 106 (phase shift $\Delta\varphi_{TSG}$) and one of the phase shifters 105 (phase shift $\Delta\varphi_{TX01}$).

The mixer output signal s$_{DC}$(t) may be sampled for various (settable) phase differences $\Delta\varphi_1$. Equation 6 contains two unknown parameters, namely the amplitude A$_{RE}$ and the phase $\varphi_{RE}$ of the RF feedback signal s$_{RE}$(t). Therefore—in theory—two sample values s$_{DC}$(t$_0$), s$_{DC}$(t$_1$) are required in order to be able to calculate the two unknown parameters. The samples s$_{DC}$(t$_0$), s$_{DC}$(t$_1$) of the mixer output signal s$_{DC}$(t) also contain noise that worsens the result. It may therefore be expedient to estimate the unknown parameters A$_{RE}$ and $\varphi_{RE}$ on the basis of a multiplicity of samples s$_{DC}$(t$_0$), s$_{DC}$(t$_1$), s$_{DC}$(t$_3$), etc. One technique for estimating the amplitude A$_{RE}$ and in particular the phase $\varphi_{RE}$ is explained in more detail below.

Figure 9:
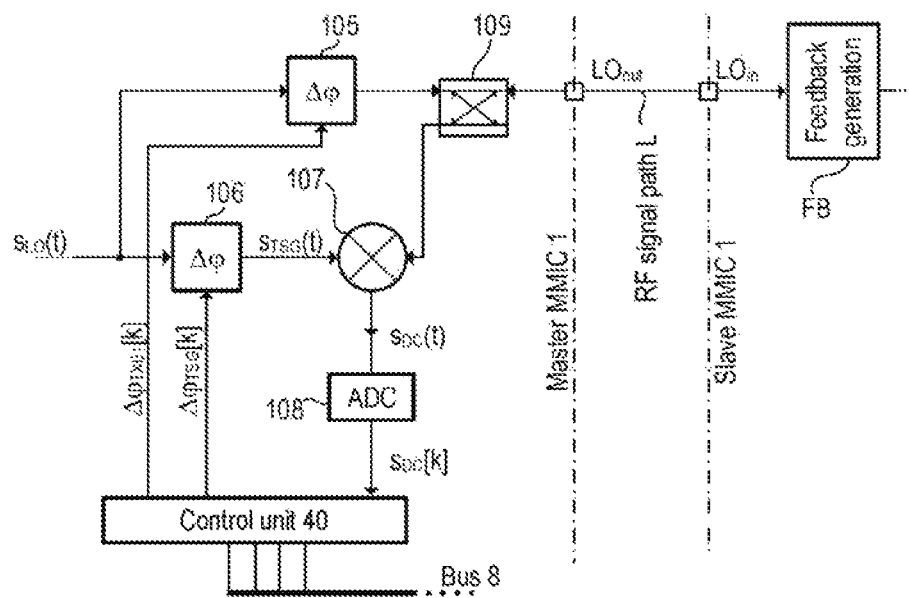
FIG. 9 is a block diagram similar to FIG. 6, but with a more detailed illustration of the measurement circuit.

FIG. 9 essentially corresponds to the general example from FIG. 6. In addition to the components illustrated in FIG. 6, FIG. 8 shows an analog-to-digital converter (ADC) 108 for sampling and digitizing the mixer output signal $s_{DC}(t)$ and a control unit 40 that receives the sample values $s_{DC}[k]$ of the mixer output signal $s_{DC}(t_k)$ ($s_{DC}[k]=s_{DC}(t_k)$) and is designed to set and to change the phase shift $\Delta\varphi_{TSG}$ (and optionally $\Delta\varphi_{TX01}$). The control unit 40 may be implemented at least partly by way of software, that is to say it contains a processor and a memory that contains instructions that prompt the processor, inter alia, to process the sample values $s_{DC}[k]$ and to set the phase shifts $\Delta\varphi_{TSG}$ and $\Delta\varphi_{TX01}$. In one simple exemplary embodiment, the control unit 40 simply forwards the sample values over the bus 8 to the external controller 50 (see also FIG. 5). In other exemplary embodiments, the control unit 40 is designed to calculate estimated values for the sought parameters $A_{RE}$ and $\varphi_{RE}$, and to transmit only the results of the calculations to the controller 50. The control unit may at least partly use the same hardware as that computer unit that evaluates the radar measurements during normal radar operation (cf. FIG. 3, DSP 40).

Figure 10:
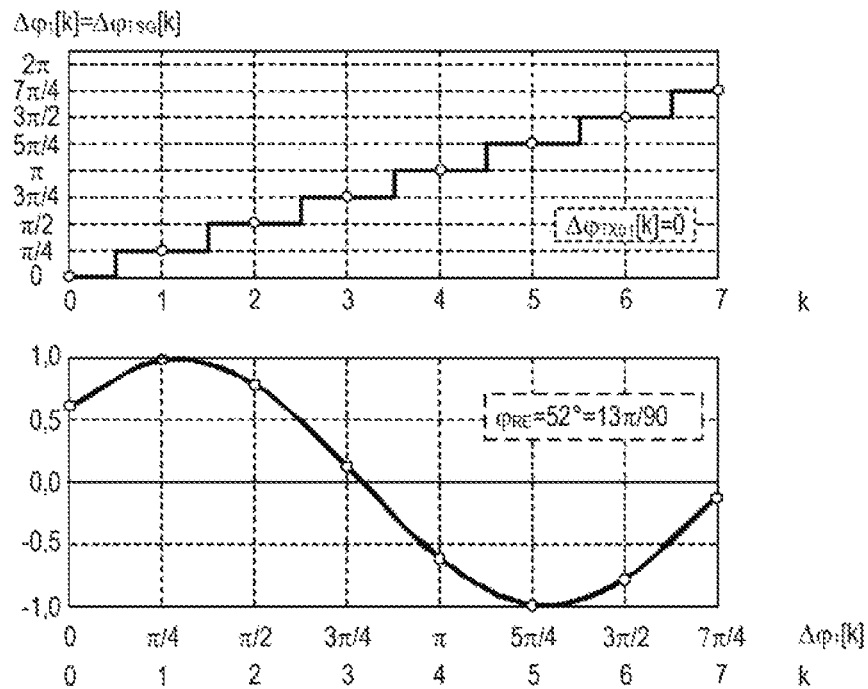
FIG. 10 illustrates one example of the phase measurement through changing, in steps, the phase shift of the RF reference signal fed to the measurement circuit.

One example of a measurement cycle for determining an estimated value for the sought parameters $A_{RE}$ and $\varphi_{RE}$ is illustrated in FIG. 10. It is once again mentioned at this juncture that, instead of the phase shifter 105 in the master MMIC 1 illustrated in FIG. 9, as an alternative, a phase shifter 105 arranged in the transmission channels of the slave MMIC 2 may also be used (cf. FIG. 7). To this end, the slave MMIC 2 may also have a control unit 40 that is designed to set the phase shift in a particular transmission channel to a desired value, for example on the basis of data received from the controller 50. According to FIG. 10, the phase difference $\Delta\varphi_1 = \Delta\varphi_{TSG} - \Delta\varphi_{TX01}$ is increased in steps, the phase difference $\Delta\varphi_{TX01}$ brought about by the phase shifter 105 being constantly set to zero in the present example, such that it holds true that $\Delta\varphi_1 = \Delta\varphi_{TSG}$.

For the top diagram from FIG. 10, it holds true that $$\Delta\varphi_{TSG}[k]=\Delta\varphi_1[k]=k\cdot\pi/4 \text{ (for } k=1,2,\ldots,7). \tag{7}$$

The mixer output signal $s_{DC}(t)$ is sampled in each step, $s_{DC}(t)$ being sampled in the kth step at the time $t_k$, that is to say $s_{DC}[k]=s_{DC}(t_k)$. For a sequence of settable phase differences $\Delta\varphi_1[k]$, a corresponding sequence of sample values $s_{DC}[k]$ is therefore obtained. If the phase difference $\Delta\varphi_1[k]$ is changed in steps of equal size, the sequence of sample values $s_{DC}[k]$ has a sinusoidal signal profile (waveform) plus noise. The amplitude and phase of the fundamental wave of this sinusoidal sequence may be calculated using various methods that are known per se, for example by way of a discrete Fourier transform (for example by way of an FFT algorithm). The amplitude and phase of this fundamental wave correspond to the sought parameters $A_{RE}$ and $\varphi_{RE}$.

The calculation of the amplitude and phase of this fundamental wave becomes particularly accurate when the phase difference $\Delta\varphi_1[k]$ in a measurement cycle is "rotated" by an integer multiple of $2\pi$, that is to say one or more complete phase rotations are caused by way of the phase shifter 106 (and/or of the phase shifter 105). Equation 7 may then be generalized as follows:

$$\Delta\varphi_{TSG}=\Delta\varphi_1[k]=k\cdot 2r\pi/N \text{ (for } k=1,2,\ldots,N-1), \tag{8}$$

wherein N denotes the number of sample values and thus the length of the sequences $\Delta\varphi_1[k]$ and $s_{DC}[k]$ and r denotes the (integer) number of phase rotations. FIG. 10 shows the case for r=1 and N=8. The fast Fourier transform (FFT) algorithm would give a discrete spectrum S[n] for the sequence illustrated in FIG. 10, the spectral value S[1] (generally S[r]) being a complex number whose magnitude and phase correspond to the sought parameters $A_{RE}$ and $\varphi_{RE}$, that is to say $$\varphi_{RE}=\arg\{S[r]\}, \text{ and } A_{RE}=2|S[r]|. \tag{9}$$

A leakage effect is avoided if the phase differences are selected in accordance with equation 8. That is to say, the remaining spectral values S[n] for n≠r are comparatively small and represent (only) the noise contained in the sample values.

It is pointed out at this juncture that a particular phase difference $\Delta\varphi_1[k]$ may be set through any desired combination of the phase shifts $\Delta\varphi_{TSG}[k]$ and $\Delta\varphi_{TX01}[k]$, it not making any difference whether the phase difference $\Delta\varphi_1[k]=\Delta\varphi_{TSG}[k]-\Delta\varphi_{TX01}[k]$ is positive or negative, as long as one or more complete phase rotations are made.

In the example according to FIG. 8 (reflection from unmatched impedance), a phase $\varphi_{RE}$ of the feedback signal $s_{RE}(t)$ may be determined for each slave MMIC 2-4 (see FIG. 5). In the example according to FIG. 8 (decoupling of the feedback signal at the RF output of a transmission channel), a phase $\varphi_{RE}$ of the feedback signal $s_{RE}(t)$ may be determined for each channel of a respective slave MMIC 2-4. A multiplicity of phases $\varphi_{RE,i}$ for i=1, 2, K is thus obtained, K denoting either the number of slave MMICs or the overall number of transmission channels of the slave MMICs. In this case, it is not so much the absolute values of the phases $\varphi_{RE,i}$ that are of interest, but rather the phase differences $\varphi_{RE,i} - \varphi_{RE,j}$ (for i≠j). By way of the phase shifter 105 in the transmission channels TX01, TX02, etc. of the slave MMICs 2-4 (see FIG. 7), these phase differences are able to be balanced out (compensated) and set to defined, desired values. The measurement of the phases $\varphi_{RE,i}$ and the subsequent matching of the phase shifts of the phase shifters 105 and those in the transmission channels of the slave MMICs may thus be considered to be a calibration technique.

Figure 11:
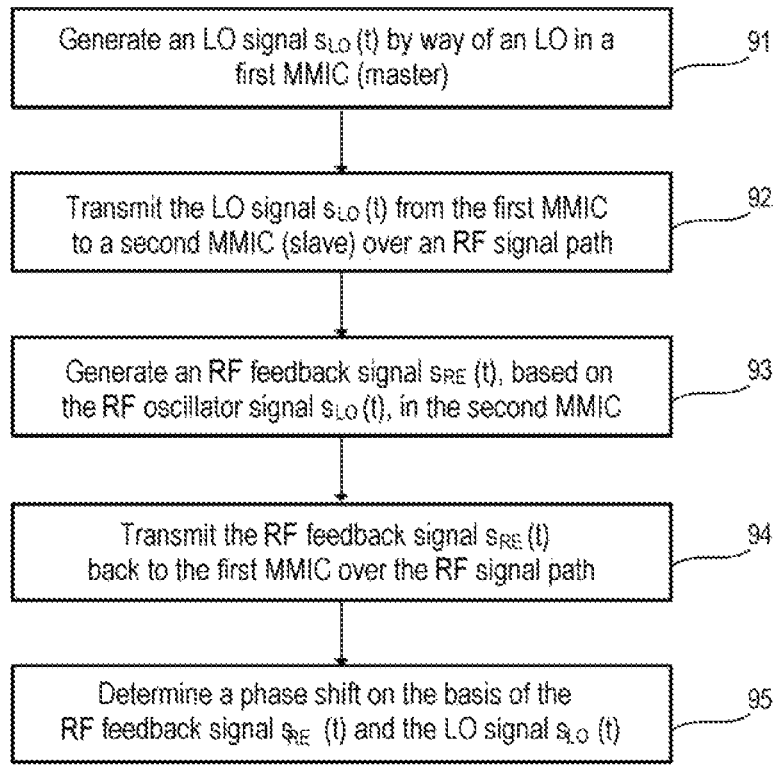
FIG. 11 is a flowchart for illustrating one example of a method for measuring the phase of an RF feedback signal received by a master MMIC, in the master MMIC.

The technique described here for determining the phases $\varphi_{RE,i}$ is summarized below with reference to the example from FIG. 11. FIG. 11 is a flowchart that describes the functions performed by a master MMIC and a slave MMIC. The master MMIC 1 uses a local oscillator (see for example FIG. 6, LO 101) to generate an LO signal $s_{LO}(t)$ (see FIG. 11, step 91) which is transmitted to a slave MMIC (see FIG. 11, step 92), for example to one of the slave MMICs 2-4 (cf. for example FIG. 5), over an RF signal path (see for example FIG. 9, RF line L). In the slave MMIC, an RF feedback signal $s_{RE}(t)$ is generated on the basis of the received LO signal $s_{LO}'(t)$ (see FIG. 11, step 93), for example by way of reflection from an unmatched impedance (cf. FIG. 8) or by way of decoupling part of the power of the received LO signal $s_{LO}'(t)$ from the LO signal path in the slave MMIC and feeding the decoupled signal back into the RF signal path (cf. FIG. 7). The RF feedback signal $s_{RE}(t)$ is transmitted back to the first MMIC over the RF signal path (see FIG. 11, step 94), which MMIC is then able to use a measurement circuit to determine the sought phase shift $\varphi_{RE}$ on the basis of the RF feedback signal $s_{RE}(t)$ and the LO signal $s_{LO}(t)$ (see FIG. 11, step 95).

In one exemplary embodiment, determining the sought phase shift $\varphi_{RE}$ comprises mixing the RF feedback signal $s_{RE}(t)$ with a reference signal, which may be a phase-shifted version of the LO signal $s_{LO}(t)$ (see FIG. 9, reference signal $s_{TSG}(t)$). Since both mixer input signals have the same frequency $f_{LO}$, the mixer output signal $s_{DC}(t)$ is a DC voltage. The sought phase shift $\varphi_{RE}$ may be determined on the basis of the mixer output signal $s_{DC}(t)$. This is for example sampled multiple times, the phase shift of one of the phase shifters (see for example FIG. 6, phase shifter 106, or FIG. 7, phase shifter 105) being changed between the individual sample values $s_{DC}[k]$ (see for example FIG. 10). A sequence of samples $s_{DC}[k]$ is thus created, on the basis of which it is possible to estimate the sought phase shift $\varphi_{RE}$ and also the amplitude of the RF feedback signal. In the example according to FIG. 7, in particular the phase shifter 105 in the transmission channel under consideration of the slave MMIC may be used to change the phase $\Delta\varphi_1[k]=\Delta\varphi_{TSG}[k]-\Delta\varphi_{TX01}[k]$. This is not possible in the example according to FIG. 8; in this case, the phase $\Delta\varphi_1[k]=\Delta\varphi_{TSG}[k]-\Delta\varphi_{TX01}[k]$ is able to be changed by the phase shifter 106 of the measurement circuit 150 or the phase shifter 105 in the LO output channel of the master MMIC.

The measurement/estimation of the phase $\varphi_{RE}$ may be performed for each slave MMIC or for each transmission channel of each slave MMIC. A phase $\varphi_{RE,i}$ is thus obtained for each slave MMIC or for each transmission channel. By way of the phase shifters arranged in the transmission channels of the slave MMIC (see for example FIG. 7), possible differences between the phases $\varphi_{RE,i}$ are able to be balanced out, or particular phase differences $\varphi_{RE,i}-\varphi_{RE,j}$ (for i≠j) are able to be set. These measurements may also be regularly repeated during radar operation, for example after the temperature of the radar system has changed by a predefined value.

Figure 12:
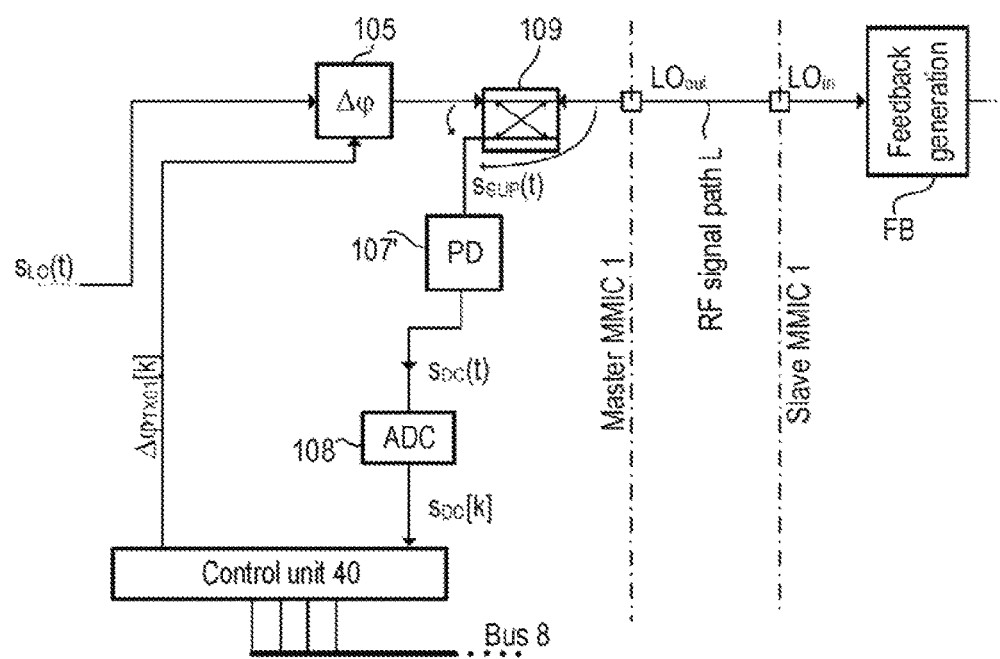
FIG. 12 uses a block diagram to show one example of an alternative implementation to FIG. 9.

FIG. 12 shows one example of an alternative implementation to the circuit from FIG. 9, the mode of operation being very similar. The example from FIG. 12 is essentially identical to FIG. 9, the function of the mixer 107 being taken over by the power sensor 107'. The mixer 107 is not required in this example and may be omitted. The phase shifter 106 coupled to the mixer 107 is also no longer required. Integrated RF power sensors are known per se and are therefore not explained further here. Diodes are usually used for power detection of an RF signal. The output signal of the power sensor 107' is a DC signal that indicates the power of the RF signal at the input of the power sensor 107'.

Due to the non-ideal isolation properties, part of the output signal $s_{TX01}(t)$ of the RF channel TX01 is routed from the coupler 109 to the input of the power sensor 107'. This leakage signal $s_{LEAK}(t)$ is a phase-shifted and attenuated version of the LO signal, and may be calculated as follows $$s_{LEAK}(t)=D_1 \cdot s_{TX01}(t)=D_1 \cdot A_{LO} \cdot \cos(2\pi f_{LO}t+\varphi_{LO}+\Delta\varphi_{TX01}), \quad (10)$$

wherein $D_1$ is the transmission loss of the coupler 109 (for example −20 dB).

The leakage signal $s_{LEAK}(t)$ superimposes on the feedback signal $s_{RE}(t)$ at the input of the power sensor 107' (see equation 3). The sum signal $s_{SUP}(t)$ is calculated as follows:

$$s_{SUP}(t)=s_{LEAK}(t)+s_{RE}(t). \quad (11)$$

The power P(t) of the measured signal is proportional to the square of the sum signal, that is to say $$P(t)\sim[s_{sup}(t)]^2. \quad (12)$$

By combining equations 3, 10 and 11 and calculating the square, the following is obtained for the average power $\overline{P(t)}$ $$\overline{P(t)}\sim\tfrac{1}{2}[(D_1 \cdot A_{LO})^2+A_{RE}^2+2D_1 A_{LO} A_{RE} \cdot \cos(\varphi_{LO}-\varphi_{RE})], \quad (13)$$

wherein all terms containing the double LO angular frequency $4\pi f_{LO}$ are ignored because they were eliminated by the averaging in the power sensor. The output signal of the power sensor is denoted hereinafter by $s_{DC}(t)$ and may be described as follows:

$$s_{DC}(t)=A_0+A_{DC} \cdot \cos(\varphi_{RE}-\varphi_{LO}). \quad (14)$$

Apart from the constant offset $A_0$, the output signal $s_{DC}(t)$ of the power sensor is identical to the output signal of the mixer 107 in the example from FIG. 9 (see equation 6) and the phase angle $\varphi_{RE}$ may be determined in the same way as in the example from FIG. 9 if the phase angle is changed in steps over one or more full phase rotations in the slave MMIC 2 (as shown in FIG. 10), for example by way of the phase shifter 105 in the slave MMIC from FIG. 7. In this case, the phase angle $\varphi_{RE}$ may be replaced by $\varphi_{RE}+\Delta\varphi_{TX01}$ and, from equation 14, becomes (for $\varphi_{LO}=0$)

$$s_{DC}(t)=A_0+A_{DC} \cdot \cos(\varphi_{RE}+\Delta\varphi_{TX01}). \quad (15)$$

The output signal $s_{DC}(t)$ of the power sensor 107 is digitized by way of the ADC 108 and the evaluation, for example by way of FFT, may be performed in the control unit 40 (that is to say in a computer unit contained therein). For the rest, reference is made to the description of FIGS. 6 and 9.

What is claimed is:

1. A radar system, comprising:
   a first radar chip with a first radio-frequency (RF) contact;
   a second radar chip with a second RF contact;
   an RF signal path that connects the first RF contact of the first radar chip to the second RF contact of the second radar chip;
   a local oscillator arranged in the first radar chip and configured to generate an RF oscillator signal, wherein the local oscillator is coupled to the first RF contact in order to transmit the RF oscillator signal to the second radar chip;
   a feedback circuit arranged in the second radar chip, wherein the feedback circuit is coupled to the second RF contact and is configured to reflect at least part of the RF oscillator signal arriving via the RF signal path as an RF feedback signal; and
   a measurement circuit arranged in the first radar chip and coupled to the first RF contact via a coupler in order to receive the RF feedback signal,
   wherein the measurement circuit is configured to, based on the RF feedback signal and the RF oscillator signal generated by the local oscillator, to generate a signal representing a phase shift.

2. The radar system as claimed in claim 1, further comprising:
   a circuit board on which the first radar chip and the second radar chip are arranged, wherein the RF signal path comprises a stripline arranged on the circuit board.

3. The radar system as claimed in claim 1,
   wherein the measurement circuit includes a mixer configured to mix the RF feedback signal and the RF oscillator signal generated by the local oscillator, wherein the signal representing the phase shift is a mixer output signal of the mixer.

4. The radar system as claimed in claim 3, further comprising:
   a phase shifter configured to cause the phase shift, wherein the phase shifter is connected in the first radar chip between the local oscillator and the first RF contact or is connected between the local oscillator and the mixer.

5. The radar system as claimed in claim 1,
wherein the measurement circuit includes an RF power sensor configured to determine an average power of an RF signal that is a superimposition of the RF feedback signal and of the RF oscillator signal, and
wherein the signal representing the phase shift is an output signal of the RF power sensor.

6. The radar system as claimed in claim 5,
wherein the RF power sensor is coupled to the first RF contact via a coupler such that a superimposition of the RF feedback signal arriving at the first RF contact and of the RF oscillator signal output at the first RF contact is fed to the RF power sensor.

7. The radar system as claimed in claim 4,
wherein the measurement circuit further includes an analog-to-digital converter configured to digitize the signal representing the phase shift.

8. The radar system as claimed in claim 7,
wherein the analog-to-digital converter is furthermore configured to sample the signal representing the phase shift multiple times, wherein the phase shift brought about by the phase shifter is changed between samples of the signal representing the phase shift; and
wherein the radar system further comprises at least one processor configured to determine the phase shift from the sampled signal representing the phase shift.

9. The radar system as claimed in claim 8,
wherein the feedback circuit has a terminating impedance that is connected to the second RF contact in a switchable manner and the terminating impedance has an impedance value such that the RF oscillator signal arriving over the RF signal path is at least partly reflected.

10. The radar system as claimed in claim 1, wherein the feedback circuit comprises:
a transmission channel arranged in the second radar chip and to which the RF oscillator signal arriving at the second RF contact is fed as an input signal, wherein the transmission channel is configured to generate an RF output signal on the basis of the input signal and to output the RF output signal at an RF output of the second radar chip,
wherein the transmission channel includes a coupler that is coupled to the RF output and the second RF contact, and the coupler is configured to decouple part of the power of the RF output signal as the RF feedback signal and to feed the RF feedback signal to the second RF contact such that the RF feedback signal is transmitted back to the first radar chip over the RF signal path.

11. The radar system as claimed in claim 10, further comprising:
a phase shifter that is arranged in the transmission channel of the second chip between the second RF contact and the RF output.

12. The radar system as claimed in claim 1, further comprising:
at least one phase shifter that is arranged in the second chip and is configured to influence a phase of the RF feedback signal.

13. A radar chip, comprising:
a radio-frequency (RF) contact configured to receive an RF oscillator signal;
a feedback circuit with a terminating impedance that is connected to the RF contact in a switchable manner and that has an impedance value such that the received RF oscillator signal is at least partly reflected;

a transmission channel to which the RF oscillator signal received at the RF contact is fed as an input signal, wherein the transmission channel is configured to, based on the input signal, generate an RF output signal and to output the RF output signal at an RF output.

14. A method for a radar system, the method comprising:
generating a radio-frequency (RF) oscillator signal by way of a local oscillator in a first radar chip;
transmitting the RF oscillator signal from the first radar chip to a second radar chip over an RF signal path;
generating an RF feedback signal that is based on the RF oscillator signal, wherein the RF feedback signal in the second radar chip is generated either through reflection of at least part of the RF oscillator signal or through decoupling part of the RF oscillator signal by way of a coupler;
transmitting the RF feedback signal back to the first radar chip over the RF signal path; and
determining a phase shift on a basis of the RF feedback signal and the RF oscillator signal.

15. The method as claimed in claim 14,
wherein the RF feedback signal in the second radar chip is generated in that the RF oscillator signal is reflected from an unmatched terminating impedance arranged in the second radar chip.

16. The method as claimed in claim 14,
wherein the RF feedback signal in the second radar chip is generated in that the RF oscillator signal in the second radar chip is routed to an RF output and part of the power output at the RF output is decoupled as the RF feedback signal by the coupler.

17. The method as claimed in claim 14, wherein determining the phase shift further comprises:
mixing, by a mixer, the RF feedback signal with an RF reference signal generated based on the RF oscillator signal to generate a mixed signal;
determining the phase shift on the basis of the mixed signal.

18. The method as claimed in claim 17, wherein determining the phase shift on the basis of the mixed signal further comprises:
changing a phase of at least one of the RF reference signal or the phase of the RF feedback signal;
generating a digital signal by sampling the mixed signal for various phase values of the at least one of the RF reference signal or the RF feedback signal;
wherein the digital signal comprises a plurality of samples with each of which associated with a particular phase of the RF oscillator signal;
calculating the phase shift from the digital signal.

19. The method as claimed in claim 18, wherein changing the phase of the RF feedback signal comprises:
changing the phase of the RF oscillator signal transmitted to the second radar chip over the RF line, or
changing the phase of the RF oscillator signal received by the second radar chip in the second radar chip.

20. The method as claimed in claim 14, wherein determining the phase shift further comprises:
determining a power of an RF signal that is a superimposition of the RF feedback signal and of the RF oscillator signal.

21. The method as claimed in claim 20,
wherein the RF feedback signal transmitted back to the first radar chip and the RF oscillator signal transmitted to the second radar chip are superimposed at an input of a power sensor by way of a coupler.

22. The method as claimed in claim 14, further comprising:
- setting a phase shift brought about by a phase shifter depending on the determined phase shift, wherein the phase shifter is arranged in a transmission channel in the second radar chip.

23. The method as claimed in claim 14, further comprising:
- setting a phase shift brought about by a phase shifter depending on the determined phase shift, wherein the phase shifter is arranged in the first radar chip and is configured to influence a phase of the RF oscillator signal transmitted to the second radar chip.

\* \* \* \* \*